(12) United States Patent
Choi et al.

(10) Patent No.: US 9,287,047 B2
(45) Date of Patent: Mar. 15, 2016

(54) MULTILAYER CERAMIC CAPACITOR AND BOARD WITH THE SAME MOUNTED THEREON

(71) Applicant: SAMSUNG ELECTRO-MECHANICS CO., LTD., Suwon-Si, Gyeonggi-Do (KR)

(72) Inventors: Young Don Choi, Suwon-Si (KR); Hai Joon Lee, Suwon-Si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 60 days.

(21) Appl. No.: 14/282,990

(22) Filed: May 20, 2014

(65) Prior Publication Data

US 2015/0213957 A1    Jul. 30, 2015

(30) Foreign Application Priority Data

Jan. 27, 2014    (KR) .................. 10-2014-0009381

(51) Int. Cl.
| | | |
|---|---|---|
| H05K 1/16 | (2006.01) | |
| H01G 4/30 | (2006.01) | |
| H05K 1/18 | (2006.01) | |
| H01G 4/12 | (2006.01) | |
| H01G 4/005 | (2006.01) | |
| H01G 2/06 | (2006.01) | |

(52) U.S. Cl.
CPC .................. *H01G 4/30* (2013.01); *H01G 2/065* (2013.01); *H01G 4/005* (2013.01); *H01G 4/12* (2013.01); *H05K 1/181* (2013.01); *H05K 2201/10015* (2013.01)

(58) Field of Classification Search
CPC ........... H01G 4/005; H01G 4/06; H01G 4/12; H01G 4/30; H01G 4/228; H05K 1/18; H05K 1/181; H05K 3/3442

USPC ........ 174/260; 361/301.4, 303, 306.1, 306.3, 361/321.2

See application file for complete search history.

(56) References Cited

U.S. PATENT DOCUMENTS

| | | | | |
|---|---|---|---|---|
| 6,226,169 | B1 * | 5/2001 | Naito .................. | H01G 4/01 361/303 |
| 6,278,602 | B1 * | 8/2001 | Haratani .............. | H01G 4/005 361/303 |
| 2006/0018081 | A1 * | 1/2006 | Hwa Lee .............. | H01G 4/30 361/321.2 |
| 2008/0291600 | A1 * | 11/2008 | Takashima .......... | H01G 4/228 361/306.1 |

(Continued)

FOREIGN PATENT DOCUMENTS

| | | |
|---|---|---|
| JP | 2010-129637 A | 6/2010 |
| JP | 2012-069766 A | 4/2012 |
| JP | 2012-138415 A | 7/2012 |

*Primary Examiner* — Xiaoliang Chen
(74) *Attorney, Agent, or Firm* — McDermott Will & Emery LLP

(57) ABSTRACT

A multilayer ceramic capacitor may include: a ceramic body including a plurality of dielectric layers; a first capacitor part including a first internal electrode and a second internal electrode disposed in the ceramic body; second to fifth capacitor parts including a third internal electrode having first and second leads and a fourth internal electrode having third and fourth leads, the third and fourth internal electrodes being disposed on one dielectric layer in the ceramic body, and fifth and sixth internal electrodes disposed on another dielectric layer in the ceramic body; and a first external electrode and a second external electrode. The first capacitor part and the second to fifth capacitor parts may be connected in parallel to each other.

8 Claims, 10 Drawing Sheets

(56) References Cited

U.S. PATENT DOCUMENTS

| | | | | |
|---|---|---|---|---|
| 2008/0310077 A1* | 12/2008 | Itamura | .................. | H01G 4/228 361/306.3 |
| 2009/0244803 A1* | 10/2009 | Lee | ........................ | H01G 4/012 361/301.4 |
| 2009/0290280 A1* | 11/2009 | Takeuchi | .............. | H01G 4/005 361/303 |
| 2009/0316330 A1* | 12/2009 | Taniguchi | .............. | H01G 4/012 361/306.3 |
| 2010/0128413 A1 | 5/2010 | Takashima et al. | | |
| 2010/0188799 A1* | 7/2010 | Galvagni | ............... | H01G 4/012 361/306.3 |
| 2012/0162853 A1 | 6/2012 | Togashi | | |
| 2014/0311785 A1* | 10/2014 | Park | ........................ | H01G 4/385 174/260 |
| 2014/0311788 A1* | 10/2014 | Park | ........................ | H01G 4/30 174/260 |
| 2015/0213956 A1* | 7/2015 | Choi | ........................ | H01G 4/30 174/260 |

* cited by examiner

MULTILAYER CERAMIC CAPACITOR AND BOARD WITH THE SAME MOUNTED THEREON

CROSS-REFERENCE TO RELATED APPLICATION

This application claims the benefit of Korean Patent Application No. 10-2014-0009381 filed on Jan. 27, 2014, with the Korean Intellectual Property Office, the disclosure of which is incorporated herein by reference.

BACKGROUND

The present disclosure relates to a multilayer ceramic capacitor and a board with the same mounted thereon.

Multilayer ceramic capacitors, multilayer chip electronic components, are chip-type condensers mounted on printed circuit boards of various electronic products such as display devices, for example, liquid crystal displays (LCDs), plasma display panels (PDPs), or the like, computers, smart phones, mobile phones, and the like, to be charged with or discharge electricity.

Since such a multilayer ceramic capacitor (MLCC) has advantages such as a small size, high capacitance, easiness of mounting, or the like, the multilayer ceramic capacitor may be used as a component of various electronic devices.

The multilayer ceramic capacitor may have a structure composed of a plurality of dielectric layers and internal electrodes alternately stacked between the dielectric layers and having different polarities.

Particularly, in a power supply device for a central processing unit (CPU) of a computer, or the like, voltage noise due to a rapid change in a load current may be generated during a process of supplying low voltage.

Therefore, the multilayer capacitor has been widely used in the power supply device as a capacitor for decoupling in order to suppress voltage noise.

The multilayer ceramic capacitor for decoupling should have low equivalent series inductance (ESL) as an operation frequency is increased. Various researches into technology for decreasing ESL have been actively conducted.

Further, in order to more stably supply power, the multilayer ceramic capacitor for decoupling should have controllable equivalent series resistance (ESR) characteristics.

In the case in which ESR of the multilayer ceramic capacitor is lower than the required level, an impedance peak at a parallel resonance frequency generated due to ESL of a capacitor and plane capacitance of a micro processor package may increase, and impedance at a series resonance frequency of a capacitor may excessively decrease.

Therefore, in order to implement flat impedance characteristics in a power distribution network, the ESR characteristics of the multilayer ceramic capacitor for decoupling are required to be easily controlled.

Meanwhile, in accordance with the trend toward multifunction and a complex structure of CPU, power consumption has increased, and a rapid and large transient current may be generated in power. Therefore, importance of power integrity (PI) has increased.

The PI is to satisfy basic performance of a CPU by designing power impedance to be further decreased to suppress a change in a voltage generated by a transient current.

Generally, a multilayer ceramic capacitor has been used as a capacitor for decoupling in order to decrease power impedance. In this case, since the transient current generated in power is a wide band current, power impedance should also be decreased in a wide band.

In addition, in accordance with the recent trend toward rapid development of mobile terminals such as tablet personal computers (PCs), ultra books, or the like, microprocessors have also been converted into miniaturized and highly integrated products.

Therefore, an area of the printed circuit board has decreased, and amounting space of the capacitor for decoupling has also been limited. Multilayer ceramic capacitors capable of being appropriately used, satisfying such a limited mounting space, have been demanded thereby.

RELATED ART DOCUMENT

Japanese Patent Laid-Open Publication No. 2012-138415

SUMMARY

Some embodiments of the present disclosure may provide a multilayer ceramic capacitor and a board having the same mounted thereon.

According to some embodiments of the present disclosure, a multilayer ceramic capacitor may include: a ceramic body including a plurality of dielectric layers and having first and second main surfaces opposing each other, first and second side surfaces opposing each other, and first and second end surfaces opposing each other; a first capacitor part including a first internal electrode disposed in the ceramic body and exposed to the first side surface and a second internal electrode disposed in the ceramic body and exposed to the second side surface; second to fifth capacitor parts including a third internal electrode having first and second leads exposed to the first and second end surfaces and a fourth internal electrode having third and fourth leads exposed to the first and second end surfaces, the third and fourth internal electrodes being disposed on one dielectric layer in the ceramic body, and fifth and sixth internal electrodes disposed on another dielectric layer in the ceramic body and spaced apart from each other; and a first external electrode disposed on the first side surface of the ceramic body and extended to the first end surface and the first and second main surfaces and a second external electrode disposed on the second side surface and extended to the second end surface of the ceramic body and first and second main surfaces. The first capacitor part and the second to fifth capacitor parts may be connected in parallel to each other.

The first and second internal electrodes may be disposed in a central portion of the ceramic body, and the third to sixth internal electrodes may be disposed on and below the first and second internal electrodes.

The first lead of the third internal electrode and the third lead of the fourth internal electrode may be connected to the first external electrode, and the second lead of the third internal electrode and the fourth lead of the fourth internal electrode may be connected to the second external electrode.

The second capacitor part may be disposed in a region in which the third and fifth internal electrodes are overlapped with each other.

The third capacitor part may be disposed in a region in which the fourth and fifth internal electrodes are overlapped with each other.

The fourth capacitor part may be disposed in a region in which the third and sixth internal electrodes are overlapped with each other.

The fifth capacitor part may be disposed in a region in which the fourth and sixth internal electrodes are overlapped with each other.

According to some embodiments of the present disclosure, a multilayer ceramic capacitor may include: a ceramic body including a plurality of dielectric layers and having first and second main surfaces opposing each other, first and second side surfaces opposing each other, and first and second end surfaces opposing each other; a first capacitor part including a first internal electrode disposed in the ceramic body and exposed to the first side surface and a second internal electrode disposed in the ceramic body and exposed to the second side surface; second to seventh capacitor parts including a third internal electrode having first and second leads exposed to the first and second end surfaces, a fourth internal electrode having third and fourth leads exposed to the first and second end surfaces, and a fifth internal electrode disposed on a position spaced apart from the third and fourth internal electrodes, the third to fifth internal electrodes being disposed on one dielectric layer in the ceramic body, and sixth to eighth internal electrodes disposed on another dielectric layer in the ceramic body and spaced apart from each other; and a first external electrode disposed on the first side surface of the ceramic body and extended to the first end surface and the first and second main surfaces and a second external electrode disposed on the second side surface of the ceramic body and extended to the second end surface and first and second main surfaces. The first capacitor part and the second to seventh capacitor parts may be connected in parallel to each other.

The first and second internal electrodes may be disposed in a central portion of the ceramic body, and the third to eighth internal electrodes may be disposed on and below the first and second internal electrodes.

The first lead of the third internal electrode and the third lead of the fourth internal electrode may be connected to the first external electrode, and the second lead of the third internal electrode and the fourth lead of the fourth internal electrode may be connected to the second external electrode.

The second capacitor part may be disposed in a region in which the third and sixth internal electrodes are overlapped with each other.

The third capacitor part may be disposed in a region in which the fourth and sixth internal electrodes are overlapped with each other.

The fourth capacitor part may be disposed in a region in which the third and seventh internal electrodes are overlapped with each other.

The fifth capacitor part may be disposed in a region in which the fifth and seventh internal electrodes are overlapped with each other.

The sixth capacitor part may be disposed in a region in which the fifth and eighth internal electrodes are overlapped with each other.

The seventh capacitor part may be disposed in a region in which the fourth and eighth internal electrodes are overlapped with each other.

According to some embodiments of the present disclosure, a board having a multilayer ceramic capacitor mounted thereon may include: a printed circuit board having first and second electrode pads disposed thereon; and the multilayer ceramic capacitor as described above mounted on the printed circuit board.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
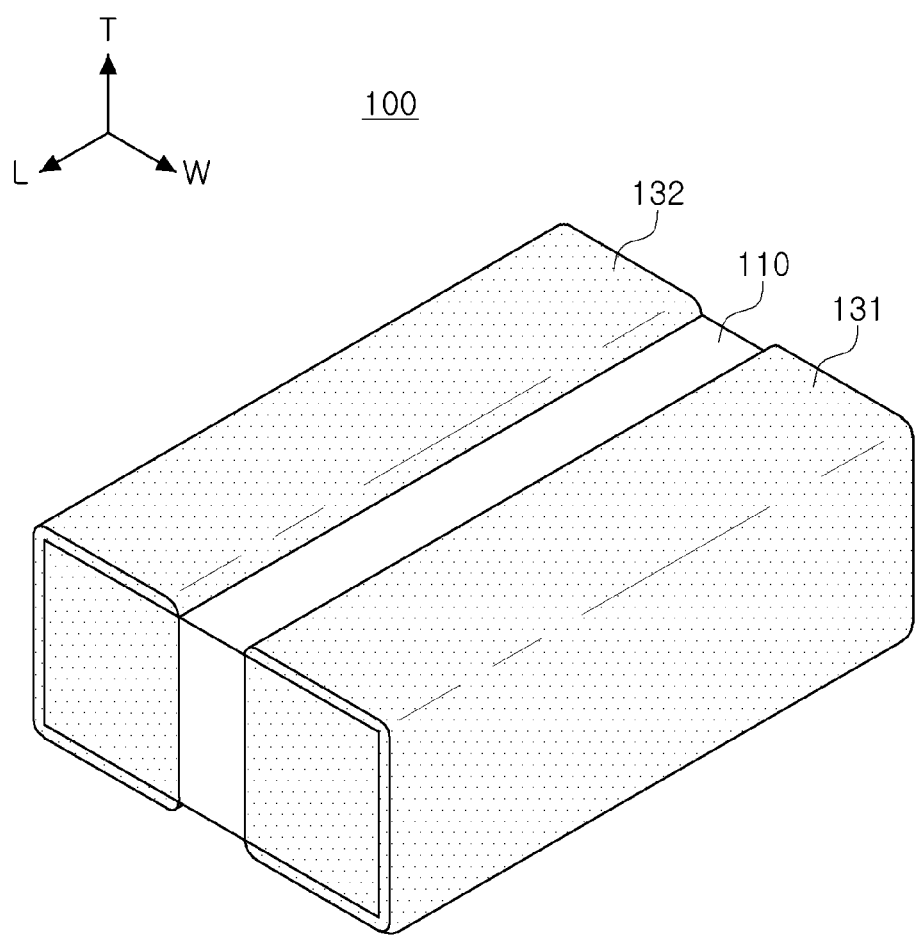
FIG. 1 is a perspective diagram of a multilayer ceramic capacitor according to an exemplary embodiment of the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Multilayer Ceramic Capacitor

FIG. 1 is a perspective diagram of a multilayer ceramic capacitor according to an exemplary embodiment of the present disclosure.

Figure 2:
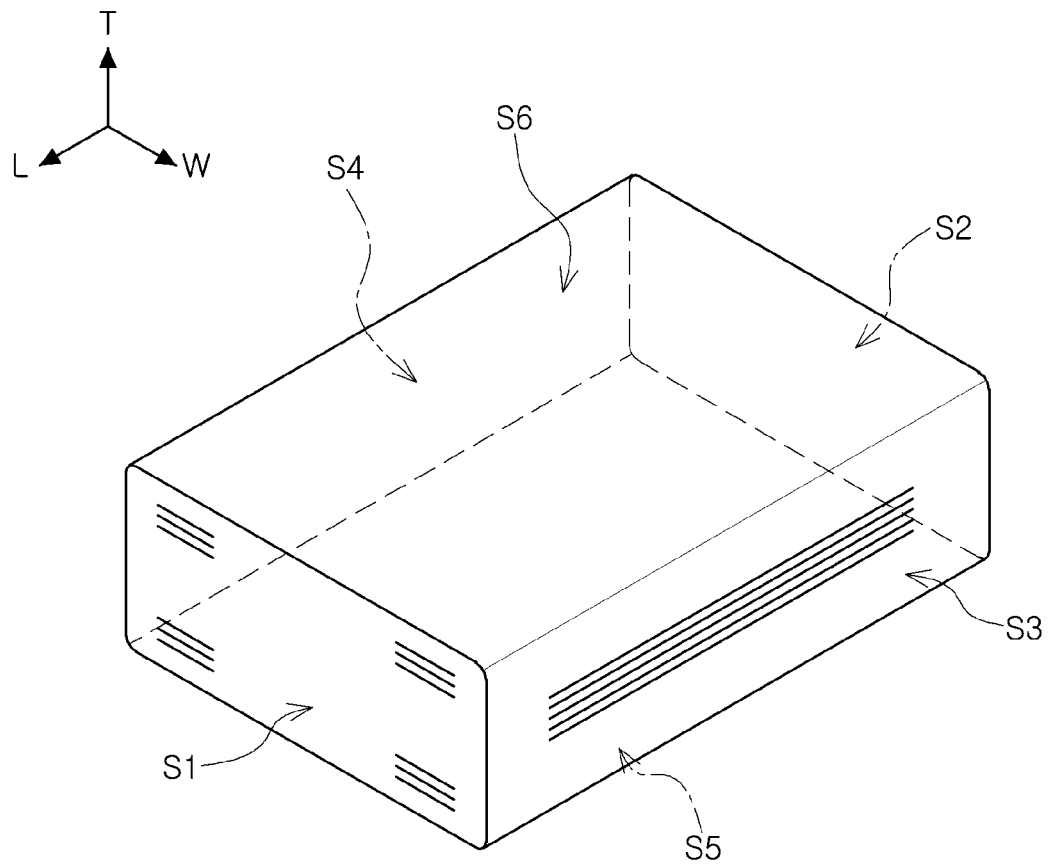
FIG. 2 is a drawing illustrating a ceramic body of the multilayer ceramic capacitor shown in FIG. 1.

FIG. 2 is a drawing illustrating a ceramic body of the multilayer ceramic capacitor shown in FIG. 1.

Figure 3:
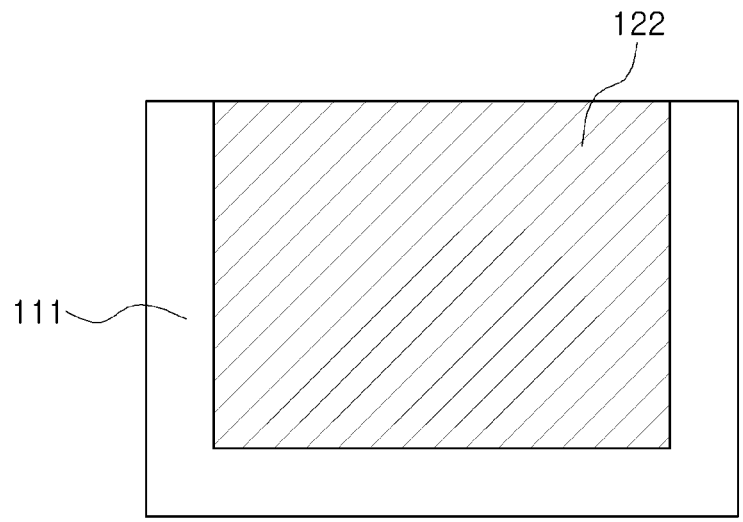
FIG. 3 is a plan diagram illustrating first and second internal electrodes used in the multilayer ceramic capacitor shown in FIG. 1.
Figure 3:
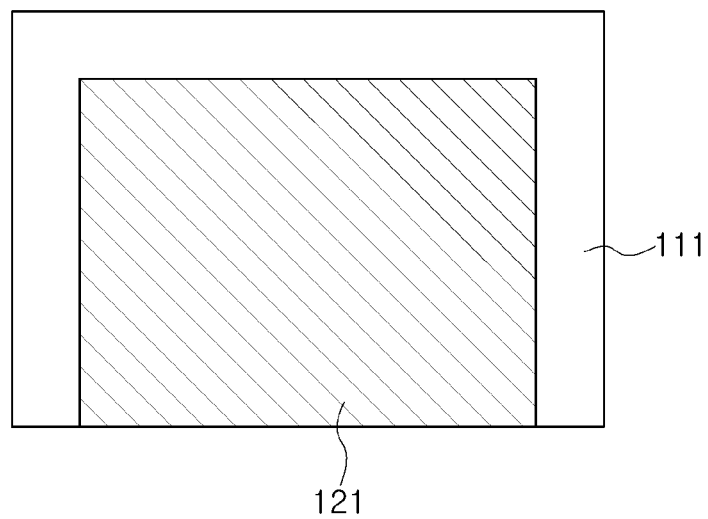

FIG. 3 is a plan diagram illustrating first and second internal electrodes used in the multilayer ceramic capacitor shown in FIG. 1.

Figure 4:
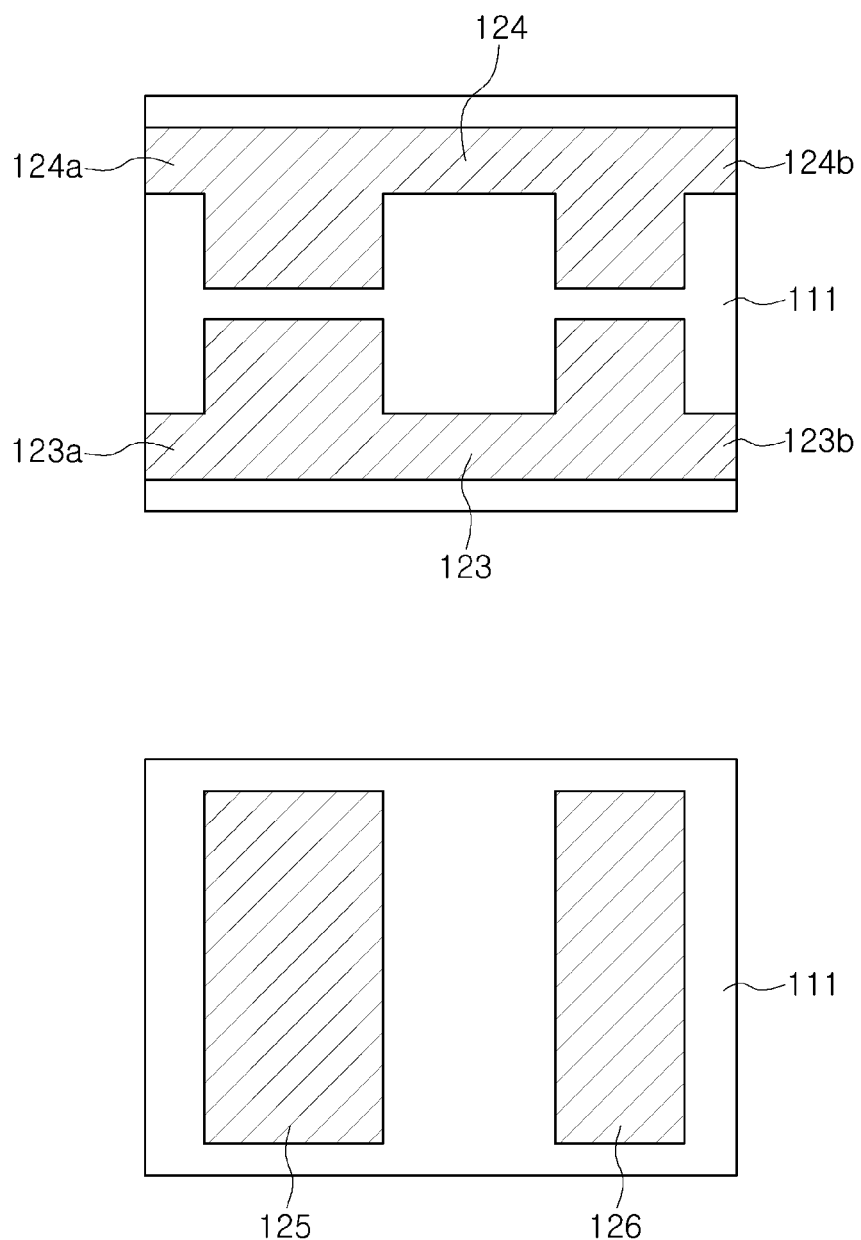
FIG. 4 is a plan diagram illustrating third to sixth internal electrodes used in the multilayer ceramic capacitor shown in FIG. 1.

FIG. 4 is a plan diagram illustrating third to sixth internal electrodes used in the multilayer ceramic capacitor shown in FIG. 1.

Referring to FIGS. 1 through 4, the multilayer ceramic capacitor 100 according to an exemplary embodiment of the present disclosure may include a ceramic body 110 including a plurality of dielectric layers 111 and having first and second main surfaces opposing each other, first and second side surfaces opposing each other, and first and second end surfaces opposing each other.

In the multilayer ceramic capacitor according to an exemplary embodiment of the present disclosure, a 'length direction' refers to an 'L' direction of FIG. 1, a 'width direction' refers to a 'W' direction of FIG. 1, and a 'thickness direction' refers to a 'T' direction of FIG. 1. Here, the 'thickness direction' may be the same as a direction in which dielectric layers are stacked, for example, a 'stacking direction'.

In the exemplary embodiment of the present disclosure, the ceramic body 110 may have first and second main surfaces S5 and S6 opposing each other, and first and second side surfaces S3 and S4 and first and second end surfaces S1 and S2 that connect the first and second main surfaces to each other.

A shape of the ceramic body 110 is not particularly limited, but may be a hexahedral shape as illustrated in the drawings.

The ceramic body 110 may be formed by stacking the plurality of dielectric layers, and a plurality of internal electrodes 121 and 122 (sequentially first and second internal electrodes) may be disposed in the ceramic body 110 so as to be separated from each other with each of the dielectric layers interposed therebetween.

The plurality of dielectric layers 111 configuring the ceramic body 110 may be in a sintered state and be integrated with each other so as not to discern a boundary between dielectric layers adjacent to each other without using a scanning electron microscope (SEM).

The dielectric layer 111 may be formed by sintering a ceramic green sheet containing a ceramic powder, an organic solvent, and an organic binder. As the ceramic powder, a high k material, a barium titanate ($BaTiO_3$) based material, a strontium titanate ($SrTiO_3$) based material, or the like, may be used. However, the ceramic powder is not limited thereto.

The first and second internal electrodes 121 and 122 may be disposed to face each other, having the dielectric layer 111 therebetween, and alternately exposed to the first or second side surface S3 or S4.

The first and second internal electrodes 121 and 122 are alternately exposed to the first or second side surface S3 or S4, such that a reverse geometry capacitor (RGC) or low inductance chip capacitor (LICC) may be implemented as described below.

According to an exemplary embodiment of the present disclosure, the first and second internal electrodes 121 and 122 may be formed of a conductive paste containing a conductive metal.

The conductive metal may be nickel (Ni), copper (Cu), palladium (Pd), or an alloy thereof, but is not limited thereto.

An internal electrode layer may be printed on a ceramic green sheet configuring the dielectric layer using the conductive paste by a printing method such as a screen printing method or a gravure printing method.

The ceramic green sheets having the internal electrode printed thereon may be alternately stacked to then be sintered, thereby forming the ceramic body.

In addition, the multilayer ceramic capacitor 100 may include first and second external electrodes 131 and 132 formed on the first and second side surfaces S3 and S4 of the ceramic body 110 and electrically connected to the first and second internal electrodes 121 and 122.

The first and second external electrodes 131 and 132 may be disposed to be spaced apart from each other on the first main surface S5 of the ceramic body 110.

The first and second external electrodes 131 and 132 may be formed of a conductive paste containing a conductive metal.

The conductive metal may be nickel (Ni), copper (Cu), tin (Sn), or an alloy thereof, but is not limited thereto.

The conductive paste may further contain an insulating material. The insulating material may be, for example, glass, but is not limited thereto.

A method of forming the first and second external electrodes 131 and 132 is not particularly limited. For example, the first and second external electrodes 131 and 132 may be formed on the ceramic body by a printing method, a dipping method, a plating method, or the like.

Thereafter, a plating layer may be further formed on the first and second external electrodes 131 and 132.

According to an exemplary embodiment of the present disclosure, a mounting surface of the multilayer ceramic capacitor 100 may be the first or second main surface S5 or S6 of the ceramic body 110.

In the case of a general multilayer ceramic capacitor having a length and a width, an external electrode may be disposed on end surfaces opposing each other in a length direction of a ceramic body.

In this case, at the time of applying an alternating current (AC) voltage to the external electrode, since a current path is relatively long, a current loop may be formed to be large, and intensity of an induced magnetic field may be increased, such that inductance may be increased.

In the multilayer ceramic capacitor according to an exemplary embodiment of the present disclosure, in order to decrease the current path, the first and second external electrodes 131 and 132 may be formed on the first and second side surfaces S3 and S4 of the ceramic body 110.

The first external electrode 131 may be formed on the first side surface S3 of the ceramic body 110 and extended to the first end surface S1 and the first and second main surfaces S5 and S6, and the second external electrode 132 may be formed on the second side surface S4 and extended to the second end surface S2 and the first and second main surfaces S5 and S6.

A width W of the ceramic body 110 may be a distance between the first side surface S3 on which the first external electrode 131 is formed and the second side surface S4 on which the second external electrode 132 is formed, and a length L of the ceramic body 110 may be a distance between the first and second end surfaces S1 and S2.

According to an exemplary embodiment of the present disclosure, a width W between the first and second side surfaces S3 and S4 on which the first and second external electrodes 131 and 132 are formed, respectively, may be smaller than or equal to the length L between the first and second end surfaces S1 and S2.

Therefore, since the distance between the first and second external electrodes 131 and 132 may be decreased, the current path may be decreased, such that the current loop may be decreased, thereby decreasing inductance.

A multilayer ceramic electronic component in which the first and second external electrodes 131 and 132 are formed on the first and second side surfaces S3 and S4 of the ceramic body 110, such that the width W of the ceramic body 110 (for example, the distance between the first and second external electrodes 131 and 132) is smaller than or equal to the length L of the ceramic body 110, may be a reverse geometry capacitor (RGC) or low inductance chip capacitor (LICC).

Further, when the length and the width of the ceramic body 110 are defined as L and W, respectively, $0.5L \leq W \leq L$ may be satisfied. However, the present disclosure is not limited thereto.

Inductance of the multilayer ceramic capacitor may be decreased by controlling the length and width of the ceramic body so as to satisfy $0.5L \leq W \leq L$.

Therefore, the multilayer ceramic capacitor according to an exemplary embodiment of the present disclosure may implement low inductance, such that electric performance may be improved.

Referring to FIGS. 3 and 4, the multilayer ceramic capacitor 100 may include a first capacitor part C1 including a first internal electrode 121 formed in the ceramic body 110 and exposed to the first side surface S3 and a second internal electrode 122 formed in the ceramic body 110 and exposed to the second side surface S4, and second to fifth capacitor parts CC1 to CC4 including a third internal electrode 123 having first and second leads 123a and 123b exposed to the first and second end surfaces S1 and S2 and a fourth internal electrode 124 having third and fourth leads 124a and 124b exposed to the first and second end surfaces S1 and S2, the third and fourth internal electrodes 123 and 124 being formed on one dielectric layer 111 in the ceramic body 110, and fifth and sixth internal electrodes 125 and 126 formed on another dielectric layer 111 in the ceramic body 110 and spaced apart from each other.

The first capacitor part C1 including the first internal electrode 121 exposed to the first side surface S3 and the second internal electrode 122 exposed to the second side surface S4 and the second to fifth capacitor parts CC1 to CC4 may be connected in parallel to one another as described below.

In the second to fifth capacitor parts CC1 to CC4, the first lead 123a of the third internal electrode 123 and the third lead 124a of the fourth internal electrode 124 may be exposed to the first end surface S1 of the ceramic body 110 to thereby be connected to the first external electrode 131.

Further, the second lead 123b of the third internal electrode 123 and the fourth lead 124b of the fourth internal electrode 124 may be exposed to the second end surface S2 of the ceramic body 110 to thereby be connected to the second external electrode 132.

In the exemplary embodiment of the present disclosure, the second capacitor part CC1 may be formed in a region in which the third and fifth internal electrodes 123 and 125 are overlapped with each other.

In the exemplary embodiment of the present disclosure, the third capacitor part CC2 may be formed in a region in which the fourth and fifth internal electrodes 124 and 125 are overlapped with each other.

In the exemplary embodiment of the present disclosure, the fourth capacitor part CC3 may be formed in a region in which the third and sixth internal electrodes 123 and 126 are overlapped with each other.

In the exemplary embodiment of the present disclosure, the fifth capacitor part CC4 may be formed in a region in which the fourth and sixth internal electrodes 124 and 126 are overlapped with each other.

The number of each of the first and second internal electrodes 121 and 122 is illustrated as one in FIG. 3, but in an actually applied embodiment of the present disclosure, the internal electrodes may be provided in plural.

Similarly, the number of each of the third to sixth internal electrodes 123 to 126 shown in FIG. 4 is one, but the third to sixth internal electrodes 123 to 126 may be provided in plural.

According to the exemplary embodiment of the present disclosure, the first capacitor part C1 including a first internal electrode 121 exposed to the first side surface S3 and the second internal electrode 122 exposed to the second side surface S4 is connected in parallel to the second to fifth capacitor parts CC1 to CC4 including the third internal electrode 123 having the first and second leads 123a and 123b exposed to the first and second end surfaces S1 and S2 and the fourth internal electrode 124 having the third and fourth leads 124a and 124b exposed to the first and second end surfaces S1 and S2, the third and fourth internal electrodes 123 and 124 being formed on one dielectric layer 111 in the ceramic body 110, and the fifth and sixth internal electrodes 125 and 126 formed on another dielectric layer 111 in the ceramic body 110 and spaced apart from each other, such that low impedance may be implemented in a relatively wide frequency region.

For example, in the multilayer ceramic capacitor according to an exemplary embodiment of the present disclosure, three self resonances are observed in impedance characteristics, and a low impedance region may be increased, such that a change in voltage of power and noise may be efficiently decreased.

Therefore, as compared with the structure according to the related art, impedance may be decreased and controlled in a relatively wide frequency region, and the number of capacitor for decoupling may be decreased, such that amounting space and cost may be decreased due to a decrease in the amount of components used.

Meanwhile, according to an exemplary embodiment of the present disclosure, the first and second internal electrodes 121 and 122 may be disposed in a central portion of the ceramic body 110, and the third to sixth internal electrodes 123 to 126 may be disposed on and below the first and second internal electrodes 121 and 122.

The first and second internal electrodes 121 and 122 are disposed in the central portion of the ceramic body 110, and the third to sixth internal electrodes 123 to 126 are disposed on and below the first and second internal electrodes 121 and 122, such that in the case of using the multilayer ceramic capacitor in a high frequency region, an excellent impedance decreasing effect may be obtained.

For example, in order to obtain the excellent impedance decreasing effect in the high frequency region, at the time of mounting the multilayer ceramic capacitor on a board, in the case in which capacitance in a region of the multilayer ceramic capacitor, close to the mounting board, is relatively low, the impedance decreasing effect in the high frequency region may be further excellent.

Therefore, the second to fifth capacitor parts CC1 to CC 4 including the third to sixth internal electrodes 123 to 126 to thereby have lower capacitance are disposed on and below the first capacitor part C1 including the first and second internal electrodes 121 and 122, such that the excellent impedance decreasing effect may be obtained in the high frequency region.

Figure 5:
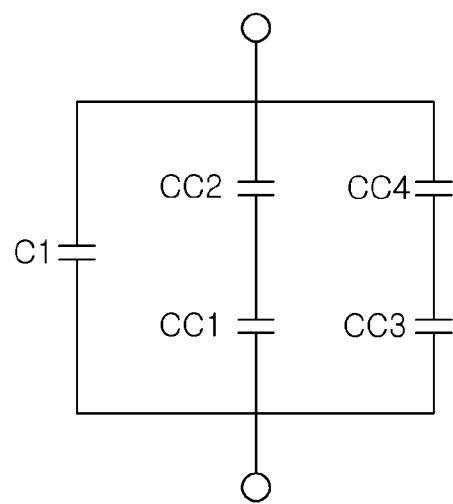
FIG. 5 is an equivalent circuit diagram of the multilayer ceramic capacitor shown in FIG. 1.

FIG. 5 is an equivalent circuit diagram of the multilayer ceramic capacitor shown in FIG. 1.

Referring to FIG. 5, the first capacitor part C1 including the first and second internal electrodes 121 and 122 and the second to fifth capacitor parts CC1 to CC4 including the third to sixth internal electrodes 123 to 126 may be connected in parallel with each other.

Further, the second and third capacitor parts CC1 and CC2 may be connected in series to each other, and the fourth and fifth capacitor parts CC3 and CC4 may be connected in series to each other.

Due to such arrangement, in the multilayer ceramic capacitor according to the exemplary embodiment of the present disclosure, three self resonances are observed in impedance characteristics, and a low impedance region may be increased, such that a change in voltage of power and noise may be efficiently decreased.

Therefore, as compared with the structure according to the related art, it may be easy to decrease and control the impedance in the wider frequency region, and the number of capacitors for decoupling may be decreased, such that amounting space and cost may be decreased due to the decrease in components.

Figure 6:
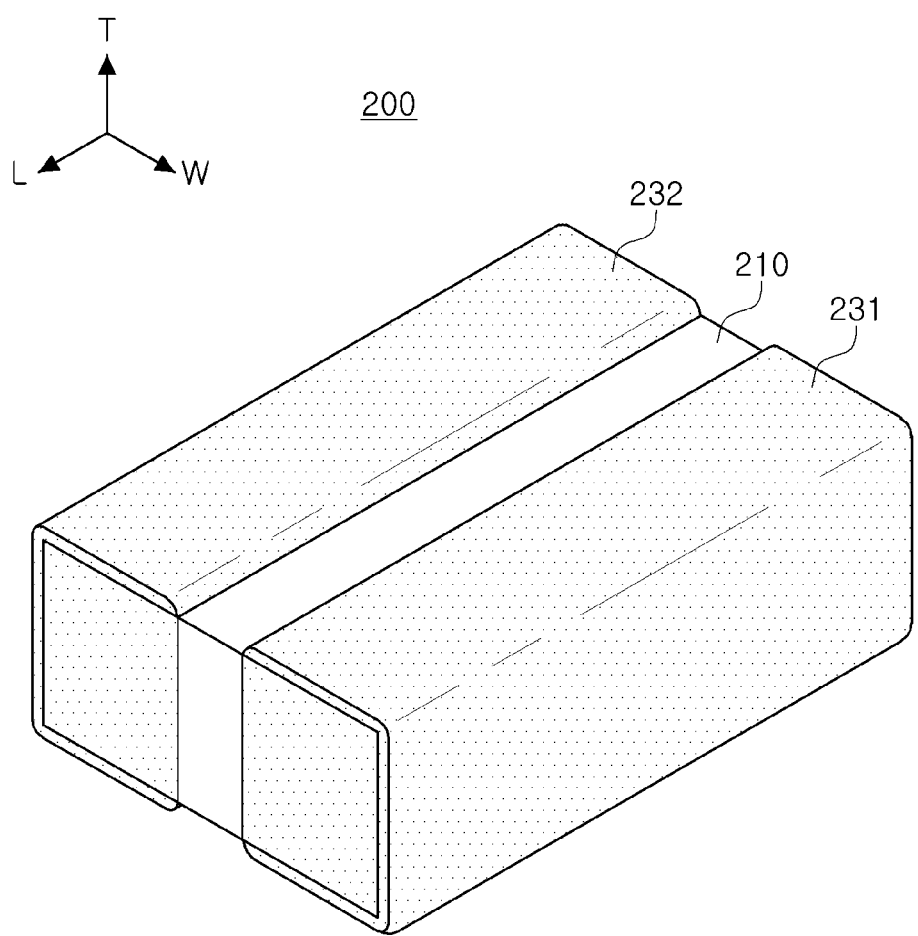
FIG. 6 is a perspective diagram of a multilayer ceramic capacitor according to another exemplary embodiment of the present disclosure.

FIG. 6 is a perspective diagram of a multilayer ceramic capacitor according to another exemplary embodiment of the present disclosure.

Figure 7:
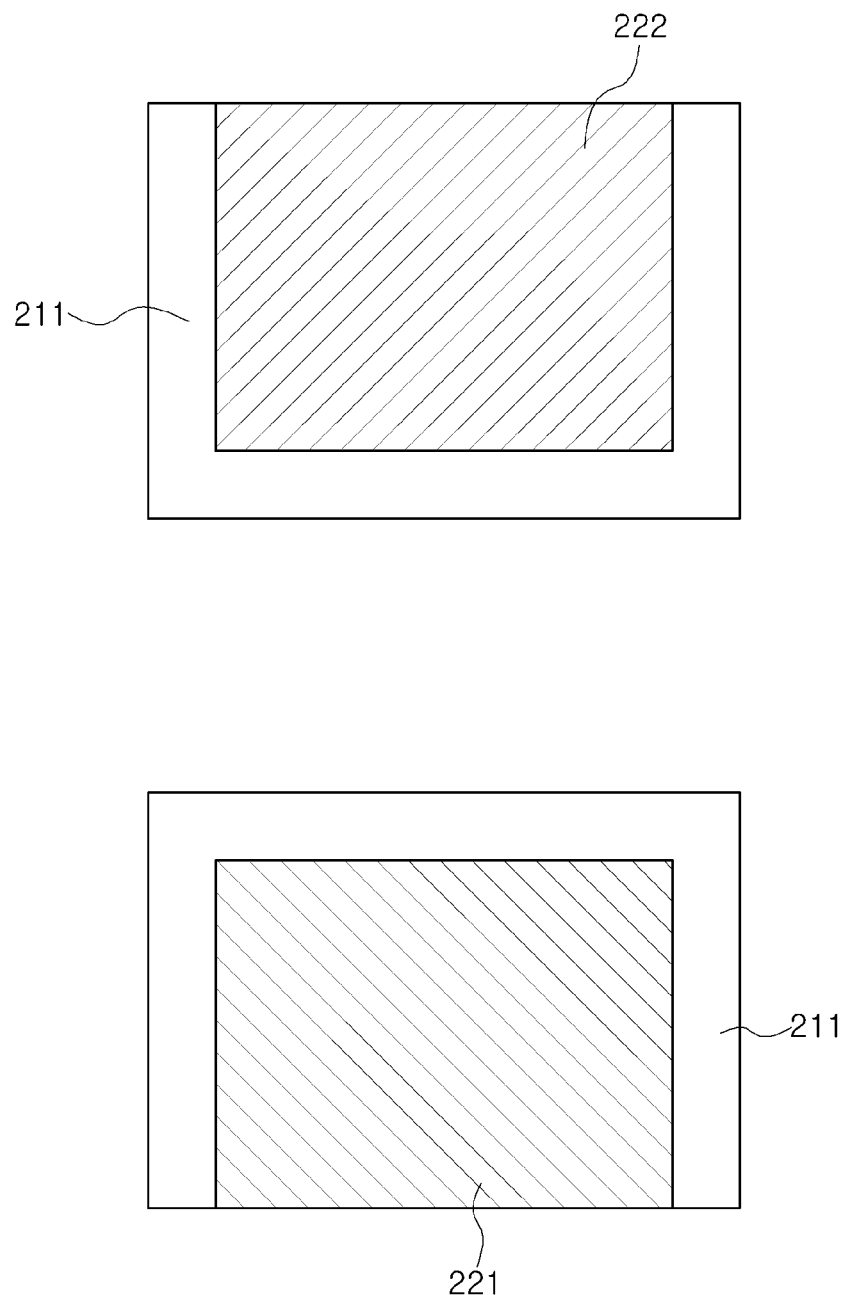
FIG. 7 is a plan diagram illustrating first and second internal electrodes used in the multilayer ceramic capacitor shown in FIG. 6.

FIG. 7 is a plan diagram illustrating first and second internal electrodes used in the multilayer ceramic capacitor shown in FIG. 6.

Figure 8:
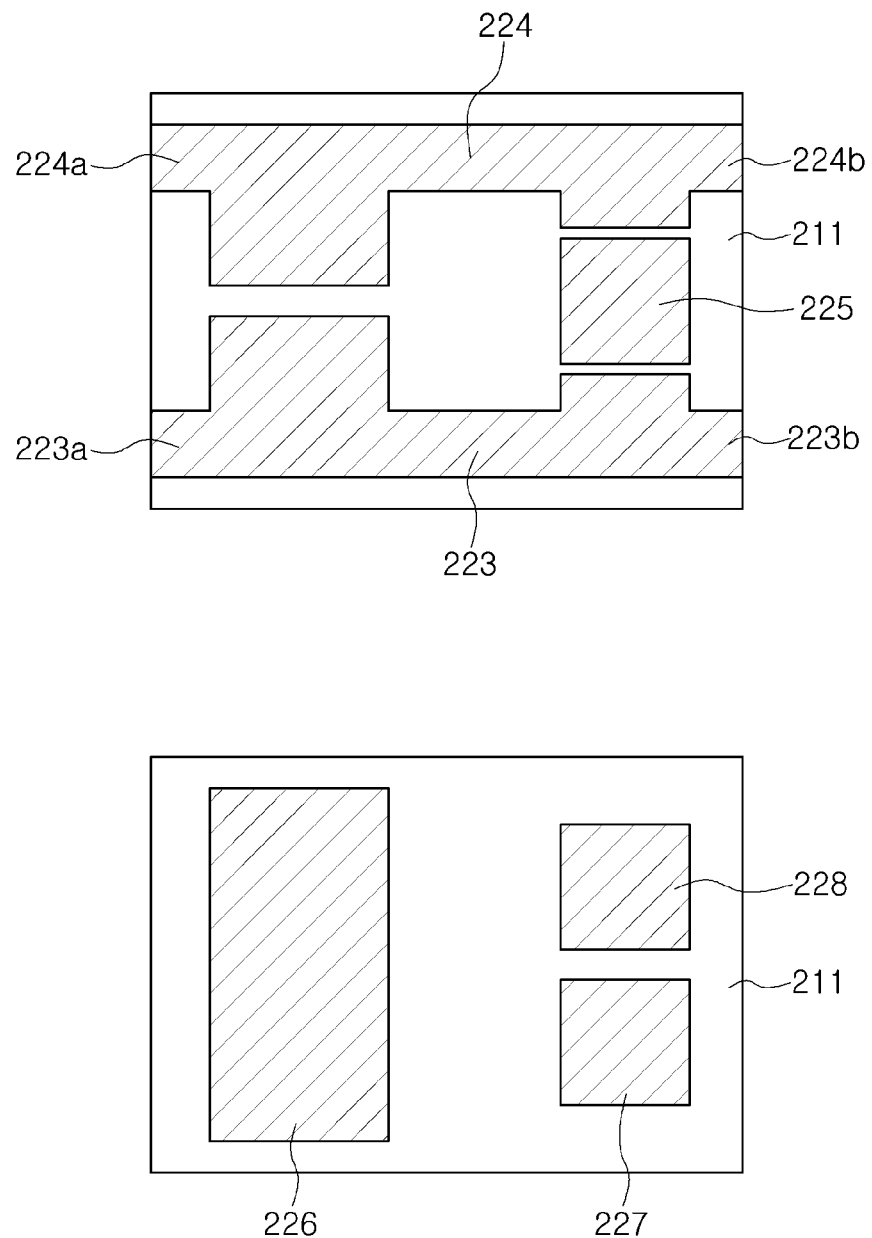
FIG. 8 is a plan diagram illustrating third to eighth internal electrodes used in the multilayer ceramic capacitor shown in FIG. 6.

FIG. 8 is a plan diagram illustrating third to eighth internal electrodes used in the multilayer ceramic capacitor shown in FIG. 6.

Referring to FIGS. 6 through 8, the multilayer ceramic capacitor 200 according to another exemplary embodiment of the present disclosure may include a ceramic body 210 including a plurality of dielectric layers 211 and having first and second main surfaces opposing each other, first and second side surfaces opposing each other, and first and second end surfaces opposing each other; a first capacitor part C1 including a first internal electrode 221 formed in the ceramic body 210 and exposed to the first side surface and a second internal electrode 222 formed in the ceramic body 210 and exposed to the second side surface; second to seventh capacitor parts CC1 to CC6 including a third internal electrode 223 having first and second leads 223a and 223b exposed to the first and second end surfaces, a fourth internal electrode 224 having third and fourth leads 224a and 224b exposed to the first and second end surfaces, and a fifth internal electrode 225 formed on a position spaced apart from the third and fourth internal electrodes 223 and 224, the third to fifth internal electrodes 223 to 225 being formed on one dielectric layer 211 in the ceramic body 210, and sixth to eighth internal electrodes 226 to 228 formed on another dielectric layer 211 in the ceramic body 210 and spaced apart from one another; and a first external electrode 231 formed on the first side surface of the ceramic body 210 and extended to the first end surface and the first and second main surfaces thereof and a second external electrode 232 formed on the second side surface of the ceramic body 210 and extended to the second end surface and first and second main surfaces thereof, wherein the first capacitor part C1 and the second to seventh capacitor parts CC1 to CC6 are connected in parallel to each other.

Meanwhile, according to another exemplary embodiment of the present disclosure, the first and second internal electrodes 221 and 222 may be disposed in a central portion of the ceramic body 210, and the third to eighth internal electrodes 223 to 228 may be disposed on and below the first and second internal electrodes 221 and 222.

In another exemplary embodiment of the present disclosure, the first lead 223a of the third internal electrode 223 and the third lead 224a of the fourth internal electrode 224 may be connected to the first external electrode 231, and the second lead 223b of the third internal electrode 223 and the fourth lead 224b of the fourth internal electrode 224 may be connected to the second external electrode 232.

In another exemplary embodiment of the present disclosure, the second capacitor part CC1 may be formed in a region in which the third and sixth internal electrodes 223 and 226 are overlapped with each other.

In another exemplary embodiment of the present disclosure, the third capacitor part CC2 may be formed in a region in which the fourth and sixth internal electrodes 224 and 226 are overlapped with each other.

In another exemplary embodiment of the present disclosure, the fourth capacitor part CC3 may be formed in a region in which the third and seventh internal electrodes 223 and 227 are overlapped with each other.

In another exemplary embodiment of the present disclosure, the fifth capacitor part CC4 may be formed in a region in which the fifth and seventh internal electrodes 225 and 227 are overlapped with each other.

In another exemplary embodiment of the present disclosure, the sixth capacitor part CC5 may be formed in a region in which the fifth and eighth internal electrodes 225 and 228 are overlapped with each other.

In another exemplary embodiment of the present disclosure, the seventh capacitor part CC6 may be formed in a region in which the fourth and eighth internal electrodes 224 and 228 are overlapped with each other.

Figure 9:
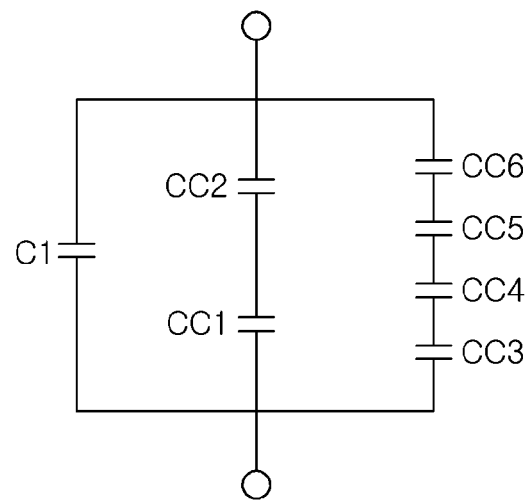
FIG. 9 is an equivalent circuit diagram of the multilayer ceramic capacitor shown in FIG. 6.

FIG. 9 is an equivalent circuit diagram of the multilayer ceramic capacitor shown in FIG. 6.

Referring to FIG. 9, the first capacitor part C1 including the first and second internal electrodes 221 and 222 and the second to seventh capacitor parts CC1 to CC6 including the third to eighth internal electrodes 223 to 228 may be connected in parallel with each other.

Further, the second and third capacitor parts CC1 and CC2 may be connected in series to each other, and the fourth to seventh capacitor parts CC3 to CC6 may be connected in series to one another.

Due to such arrangement, in the multilayer ceramic capacitor according to another exemplary embodiment of the present disclosure, three self resonances are observed in impedance characteristics, and a low impedance region may be increased, such that a change in voltage of power and noise may be efficiently decreased.

Therefore, as compared with the structure according to the related art, the impedance may be decreased and controlled in a relatively wide frequency region, and the number of capacitors for decoupling may be decreased, such that a mounting space and cost may be decreased due to the decrease in the amount of components used.

Since other features of the multilayer ceramic capacitor according to another exemplary embodiment of the present disclosure are the same as those of the multilayer ceramic capacitor according to the foregoing exemplary embodiment of the present disclosure, a detailed description thereof will be omitted.

Board Having Multilayer Ceramic Capacitor Mounted Thereon

Figure 10:
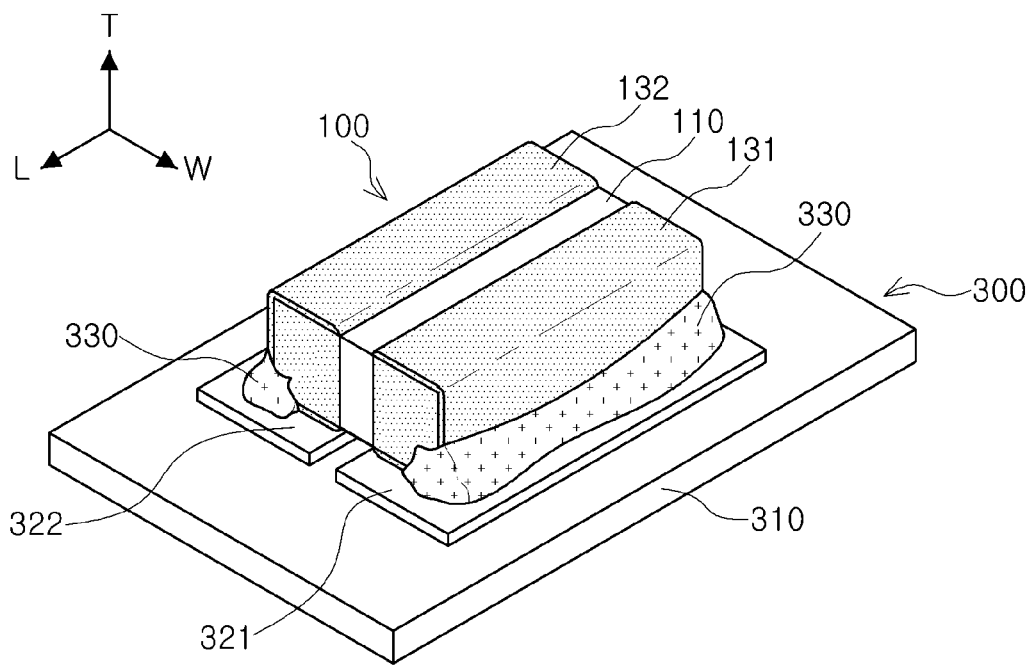
FIG. 10 is a perspective diagram illustrating a form in which the multilayer ceramic capacitor of FIG. 1 is mounted on a printed circuit board.

FIG. 10 is a perspective diagram illustrating a form in which the multilayer ceramic capacitor of FIG. 1 is mounted on a printed circuit board.

Referring to FIG. 10, a board 300 having a multilayer ceramic capacitor 100 mounted thereon according to the exemplary embodiment of the present disclosure may include a printed circuit board 310 on which the multilayer ceramic capacitor 100 is horizontally mounted and first and second electrode pads 321 and 322 formed on the printed circuit board 310 so as to be spaced apart from each other.

In this case, the multilayer ceramic capacitor 100 may be electrically connected to the printed circuit board 310 by soldering in a state in which first and second external electrodes 131 and 132 are positioned on the first and second electrode pads 321 and 322 so as to contact each other, respectively.

A description of features overlapped with those of the multilayer ceramic capacitor according to the foregoing exemplary embodiment of the present disclosure will be omitted.

Figure 11:
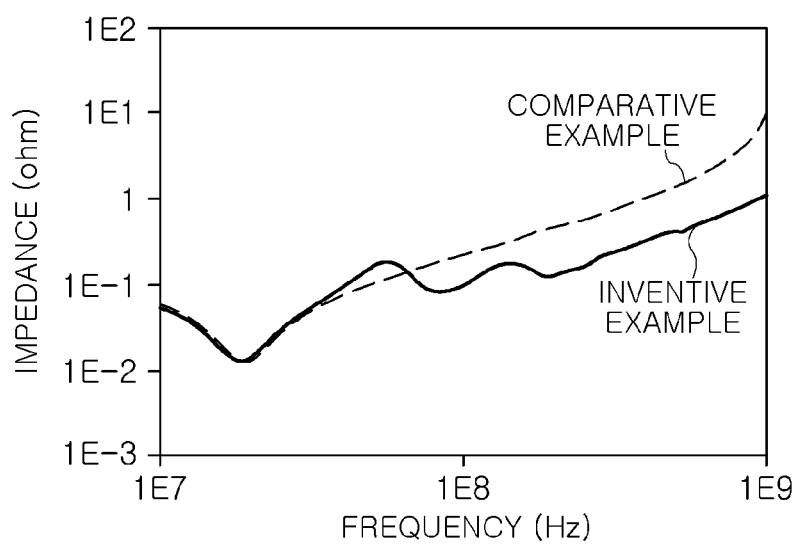
FIG. 11 is a graph for comparing impedances in Inventive Example and Comparative Example.

FIG. 11 is a graph for comparing impedances in Inventive Example and Comparative Example.

Referring to FIG. 11, it may be appreciated that in the multilayer ceramic capacitor according to an exemplary embodiment of the present disclosure, impedance may have a flat shape in a wider frequency region and the impedance may be decreased, as compared to a multilayer ceramic capacitor according to the related art in Comparative Example.

In addition, it may be appreciated that in the multilayer ceramic capacitor according to an exemplary embodiment of the present disclosure, three self resonances are observed in impedance characteristics, and a low impedance region may be relatively extended, such that a change in voltage of power and noise may be efficiently decreased.

According to exemplary embodiments of the present disclosure, in the multilayer ceramic capacitor, three self resonances are observed in impedance characteristics, and a low impedance region may be increased, such that the change in voltage of power and noise may be efficiently decreased.

Therefore, as compared with the structure according to the related art, the impedance in a wider frequency region may be decreased and controlled, and the number of capacitors for decoupling may be decreased, such that a mounting space and cost may be decreased due to the decrease in components.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic capacitor comprising:
    a ceramic body including a plurality of dielectric layers, first and second main surfaces opposing each other, first and second side surfaces opposing each other, and first and second end surfaces opposing each other;
    a first capacitor part including a first internal electrode disposed in the ceramic body and exposed to the first side surface and a second internal electrode disposed in the ceramic body and exposed to the second side surface;
    second to fifth capacitor parts including a third internal electrode having first and second leads exposed to the first and second end surfaces and a fourth internal electrode having third and fourth leads exposed to the first and second end surfaces, the third and fourth internal electrodes being disposed on one dielectric layer in the ceramic body, and fifth and sixth internal electrodes disposed on another dielectric layer in the ceramic body and spaced apart from each other; and
    a first external electrode disposed on the first side surface of the ceramic body and extended to the first end surface and the first and second main surfaces and a second external electrode disposed on the second side surface of the ceramic body and extended to the second end surface and first and second main surfaces,
    wherein the first capacitor part and the second to fifth capacitor parts are connected in parallel to each other.

2. The multilayer ceramic capacitor of claim 1, wherein the first and second internal electrodes are disposed in a central portion of the ceramic body, and the third to sixth internal electrodes are disposed on and below the first and second internal electrodes.

3. The multilayer ceramic capacitor of claim 1, wherein the first lead of the third internal electrode and the third lead of the fourth internal electrode are connected to the first external electrode, and the second lead of the third internal electrode and the fourth lead of the fourth internal electrode are connected to the second external electrode.

4. The multilayer ceramic capacitor of claim 1, wherein the second capacitor part is disposed in a region in which the third and fifth internal electrodes are overlapped with each other.

5. The multilayer ceramic capacitor of claim 1, wherein the third capacitor part is disposed in a region in which the fourth and fifth internal electrodes are overlapped with each other.

6. The multilayer ceramic capacitor of claim 1, wherein the fourth capacitor part is disposed in a region in which the third and sixth internal electrodes are overlapped with each other.

7. The multilayer ceramic capacitor of claim 1, wherein the fifth capacitor part is disposed in a region in which the fourth and sixth internal electrodes are overlapped with each other.

8. A board with a multilayer ceramic capacitor mounted thereon, comprising:
    a printed circuit board having first and second electrode pads disposed on the printed circuit board; and
    the multilayer ceramic capacitor of claim 1 mounted on the printed circuit board.

* * * * *